Aug. 3, 1971 F. W. KULESZA 3,597,333

PROCESS FOR SIMULTANEOUSLY ELECTROPLATING DISCRETE AREAS OF AN INSULATIVE SUBSTRATE

Filed Aug. 21, 1969

INVENTOR

FRANK W. KULESZA

BY Louis Orenbuch

ATTORNEY

United States Patent Office 3,597,333
Patented Aug. 3, 1971

3,597,333
PROCESS FOR SIMULTANEOUSLY ELECTROPLATING DISCRETE AREAS OF AN INSULATIVE SUBSTRATE

Frank W. Kulesza, 3 Grant Road, Winchester, Mass. 01890

Filed Aug. 21, 1969, Ser. No. 851,816
Int. Cl. C23b 5/48
U.S. Cl. 204—15 5 Claims

ABSTRACT OF THE DISCLOSURE

The process permits the simultaneous electroplating of a plurality of discrete areas of a substrate that is either a non-conductor or a poor electrical conductor. In the process, an electrically conductive thermosetting adhesive in the uncured state is deposited upon the discrete areas to be plated and the adhesive is then cured to cause it to become infusible and insoluble. An electrically conductive thermoplastic adhesive is spread upon the substrate to provide an electrical path from each discrete area to a common terminal. The electrically conductive areas that are not to be plated are covered with a plating resist. The substrate is then immersed in a plating bath with one of the electrodes connected to the common terminal and the exposed electrically conductive areas are simultaneously electroplated to the desired thickness of plate. Subsequently, the plating resist is removed to uncover the thermoplastic adhesive and the thermoplastic adhesive is dissolved with a solvent which does not affect the thermoset adhesive.

FIELD OF THE INVENTION

This invention relates in general to a method for electroplating discrete areas of a non-conductive substrate. More particularly, the invention pertains to a method for simultaneously forming on discrete areas of a non-conductive substrate a strongly adhesive metallic plate. The invention can be employed, for example, to plate plastic printing rolls to provide a hard, durable surface that will withstand much use. The invention may also be utilized to form intricate and decorative metallic patterns upon plastics, ceramics, and other materials which are poor electrical conductors. In general the invention is widely applicable in situations where it is necessary or desirable to simultaneously electroplate a large number of discrete areas on an insulative surface. For the purpose of exposition, the invention will be described as it is utilized in the manufacture of printed circuits.

BACKGROUND OF THE INVENTION

One widespread utilization of processes for simultaneous electroplating a large number of discrete areas upon an insulative surface occurs in the making of printed circuits for electrical and electronic apparatus. In making such printed circuits, it is usually intended to deposit a plate of uniform thickness upon all the discrete areas. For utmost reliability, the plated material must be highly adherent to the insulative surface in whatever environment the apparatus encounters. In environments where the apparatus is subjected to shock and extremes of temperature, it is desirable to have the plating secured to the insulative surface by an infusible, tough substance.

Insulative boards having adherent electrical conductors arranged to provide electrical connections between elements of a circuit have come to be known as "printed circuit boards." More precisely, such boards only provide the electrical wiring to which the circuit elements are soldered, welded, or otherwise joined. A printed wiring board, usually, has a pattern of many conductors that are insulated one from another. One of the common methods for making printed circuits utilizes as a starting material a sheet of copper laminated to an electrically insulative base. In making the printed electrical circuit, the areas which are to remain electrically conductive are covered with a resist or mask and the board is subjected to the action of an etchant. The copper material exposed to the etchant is dissolved, whereas the areas covered by the resist are protected from the action of the etchant and remain on the board. The board is then treated to wash away the etchant and remove the resist to expose the remaining copper. The usual process for making printed circuits by the copper etch method, while it is widely used, is uneconomical in the use of copper and presents problems in the handling and disposal of spent materials. For example, the etchant may generate noxious fumes and may be corrosive to common materials. Where the etchant is an ammonium persulfate solution, the dissolved copper must be removed from the solution before disposal of the spent etchant because of the toxicity of the metal solution.

Printed circuits are also made by a process in which the non-conductive substrate is first coated with a thin film of silver, usually about .0001" thichk. The silver film is deposited on the substrate by evaporation or is coated upon the substrate by reducing a silver solution in the same manner that mirrors are silvered. The adherent silver film is coated with a plating resist, leaving exposed those areas that are to form the circuit conductors. The circuit board is then electroplated, usually with copper, to the desired thickness. After plating, the plating resist is removed by a solvent. The exposed thin film of silver is then removed by etching to leave the much thicker copper plate in the form of the circuit pattern.

OBJECTIVES OF THE INVENTION

The primary objective of the invention is to provide a simple process for simultaneously electroplating a large number of discrete areas on an insulative base to form a highly adherent plate upon the surface of those areas. A further objective of the invention is to provide an electroplating process which does not require the use of etchants or other corrosive substances. An additional objective is to bond the plate to the base with an infusible, chemically resistant material.

THE DRAWINGS

The invention and its manner of utilization can be better understood from the exposition which follows when it is considered in conjunction with the drawings in which.

THE EXPOSITION

Figures 1, 2, 2A, 3, 4:
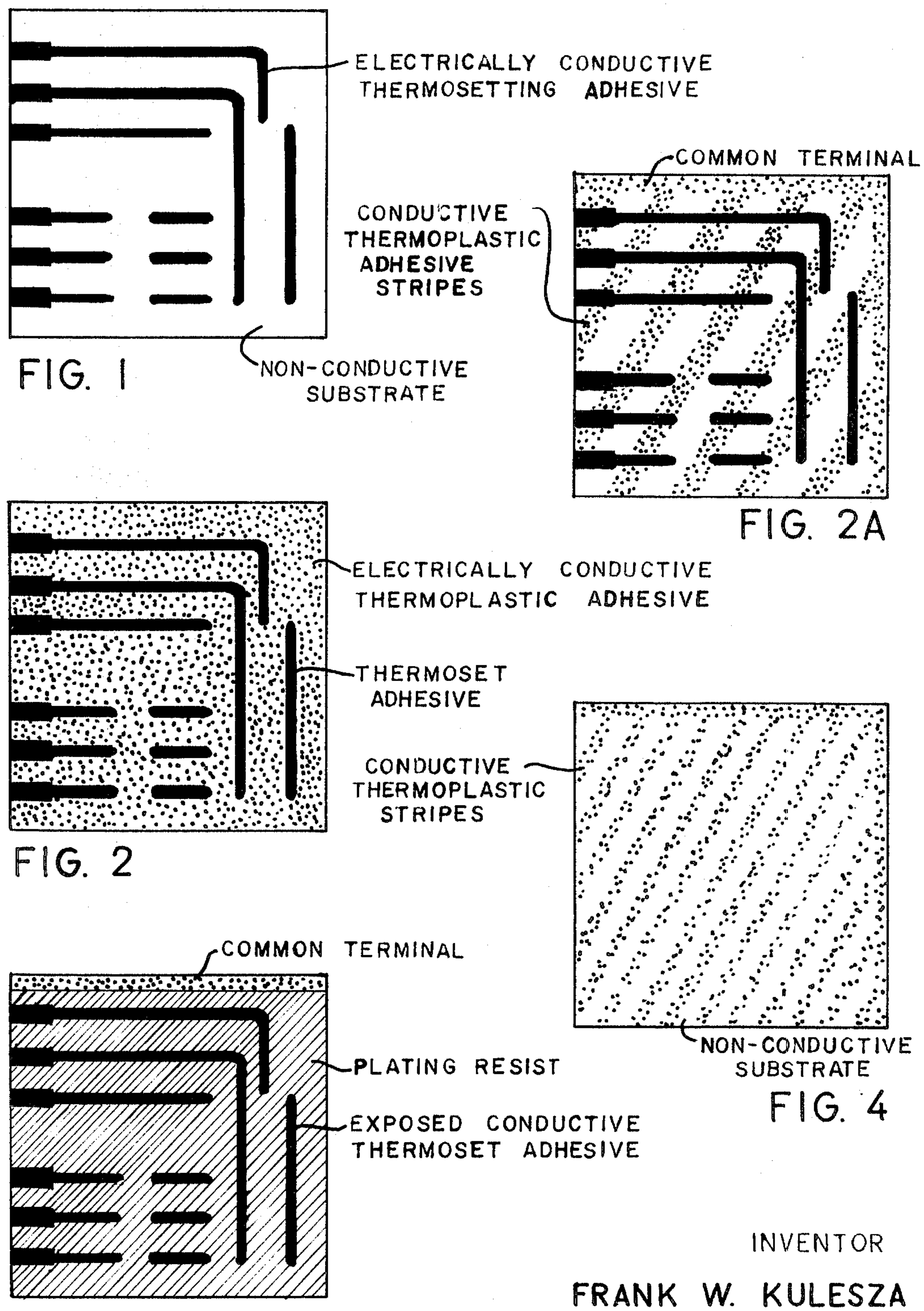
FIG. 1 shows deposits of an electrically conductive thermosetting adhesive upon an insulative substrate in the discrete areas which are to be plated.
FIG. 2 depicts, by stippling, the area of the substrate which is coated with an electrically conductive thermoplastic adhesive.
FIG. 2A depicts a modification of the process in which the thermoplastic adhesive is deposited upon substrate as a pattern of diagonal stripes.
FIG. 3 depicts, by cross-hatching, the area of the substrate which is coated with a plating resist.
FIG. 4 depicts an insulative substrate covered with a diagonal stripe pattern of thermoplastic adhesive prior to the deposition of the thermosetting adhesive.

The process of the invention, basically, involves the use of two electrically conductive adhesive materials having different properties which cause one of the adhesives to be insoluble in a solvent in which the other adhesive is highly soluble. The insoluble adhesive can be selected for its ability to adhere tenaciously to the substrate and the choice can be made from a large group of materials. The insoluble adhesive employed in the process is a thermosetting resin whereas the soluble adhesive is a thermoplastic material. Thermosetting resins are characterized by changing irreversibly under the influence of heat from a fusible and soluble material into one which is infusible and insoluble through the formation by crosslinking of a thermally stable molecular network. Thermoplastic polymers, in contrast, soften and flow when heat and pressure are applied so that its changes in form are reversible.

Although the invention is here described with reference to the making of printed circuits, the selected application is but one example of the usefulness of the process. Obviously, the process can be used whenever it is desired to plate discrete areas of a non-conductive substrate and may be used to make printing plates and to metalize plastics and ceramic materials.

In the invention, the thermosetting adhesive is electrically conductive and is deposited only upon the discrete areas to be plated whereas the thermoplastic adhesive is employed to form electrically conductive paths from a common terminal to all the discrete areas that are to be plated.

A thermosetting resin, in general, requires a hardener to cause crosslinking to occur. Where the thermosetting resin is a solid at room temperature and is dissolved in a solvent but no hardener is present, the resin can be caused to solidify by heating to drive off the solvent and then cooling to room temperature. The resin, however, will not "cure" when heated and can be again dissolved. For purposes of this exposition, the term "thermoplastic" includes thermosetting resins which cannot be cured because of the absence of a hardener.

At the present time, among the thermosetting plastics the class of synthetic materials known as "epoxy" resins have outstanding adhesive properties and would, where economic considerations permit, be the choice as the insoluble adhesive for most substrates. The advantages of epoxy resins reside in (1) the great variety of curing agents that are available, (2) the wide range of compatible modifiers which permits formulating epoxy adhesives whose properties are tailored to widely diverse specifications, (3) the 100% reactivity of epoxy resins which permits them to be cured without the production of volatiles, (4) good flow characteristics which permit the epoxy adhesives to form a highly adherent film on the substrate, and (5) the ability to enhance the heat resistance of the epoxy by using aromatic amine hardeners such as methylenedianiline and m-phenylenediamine. A thermosetting epoxy resin, when used to coat a surface, combines toughness, flexibility, adhesion and chemical resistance to a nearly unparalleled degree.

Phenolic resins, being thermosetting and somewhat less expensive than epoxies, can also be used as the insoluble adhesive but the phenolic resins are considerably weaker than the epoxy resins and the phenolic resins produce volatiles while curing.

In the invention, the thermosetting adhesive is electrically conductive and is deposited as a film upon the discrete areas to be plated. The areas to be plated are sometimes referred to as "image" areas whereas the areas which are to remain unplated are sometimes referred to as "non-image" areas. The "image" and "non-image" terminology arises from the photographic methods which are usually employed in the making of "silk" screens. For fine detail work, the screens are usually of metal wire or nylon rather than of silk. The thermosetting adhesive may be deposited upon the discrete areas of the insulative substrate in a variety of ways. For example, the thermosetting adhesive can be transferred onto the substrate by printing in the ordinary way or by employing a screen which permits the adhesive to pass through the screen only in the image areas. After being deposited in the areas to be plated, the thermosetting adhesive is cured to cause it to become infusible and insoluble. The cure is effected by heating to promote cross-linking of the molecules. The thermoplastic adhesive is employed to form electrically conductive paths from a common terminal to all the discrete areas that are to be electroplated simultaneously. The adhesion of the electrically conductive thermoplastic to the substrate can be markedly inferior to the adhesion provided by the cured thermosetting adhesive because the thermoplastic is not intended to be permanently bonded to the substrate. A plating resist is coated over the thermoplastic adhesive so that the only electrically conductive surfaces exposed are the discrete areas to be plated and the common terminal.

The board is placed in a plating bath and electrical connection to all the discrete areas is made through the common terminal. The exposed discrete areas are electroplated to the desired thickness of plate and the board is removed from the plating bath. The plating resist is removed to uncover the soluble thermoplastic adhesive. A solvent is then employed to remove the thermoplastic adhesive from the substrate. The solvent may be recovered by conventional methods and used again. Where the soluble adhesive is made electrically conductive by loading it with particles of silver or some other metal, the metal can readily be recovered.

Assuming the two adhesives employed are a thermoplastic material and a thermosetting material each of which has been made electrically conductive by loading it with finely divided silver, the preferred process of forming a printed circuit is depicted in the drawings. The substrate initially is an unclad board or plate of electrically insulative material. The substrate preferably is a material that is not attacked by the solvent used to remove the thermoplastic adhesive and which can withstand the heating cycles used in the process. A screen is prepared having a positive image of the discrete areas to be plated. The electrically conductive thermosetting adhesive is of a consistency which permits it to pass through the positive image areas of the screen and deposit as a thin film upon the substrate, as indicated in FIG. 1. In the typical circuit, most of the positive image areas are discrete, that is, are electrically isolated from one another. The circuit board is heated to the temperature required to cause the thermosetting material to cure, that is, to cause cross-linking and hardening of the material. Thereafter the thermoset material retains its shape and cannot be made to flow. A screen whose image is the negative of the positive screen image is then employed. The thermoplastic adhesive is passed through the negative image screen and is deposited upon the entire non-image areas as indicated by the stippling in FIG. 2. The board is then heated to drive off the solvents in the thermoplastic material and upon cooling the thermoplastic hardens to a form-stable state. A plating resist is then passed through a negative image screen to cover all the thermoplastic material except for a portion or terminal strip T which is left exposed as in FIG. 3. The board is again heated to drive off the solvents in the plating resist. The only areas on the surface of the board not covered by the resist are the areas to be plated and the terminal strip. The circuit board is immersed in a plating bath and electrical connection is made to the terminal strip to cause the exposed image areas to be plated. Where the terminal strip is immersed in the bath, it is also plated. The plating strip can later be trimmed off the board. However, to avoid the necessity of removing the strip, the board can be suspended to keep the terminal strip above the bath to prevent the deposit of a plate upon the terminal strip. In most instances, the plate deposited upon the image areas will be of copper to facilitate the soldering of components to the board. Where the thermosetting adhesive was made electrically conductive by loading it with finely divided silver, it was found that the copper plate gave excellent adhesion to the cured adhesive. After plating to the desired thickness, the board is removed from the plating bath and the plating resist is removed. The thermoplastic adhesive is then removed with a solvent in which the thermoset material is insoluble.

Where the solvent also is effective to dissolve the plating resist, the resist and the thermoplastic adhesive can be removed in one operation. The finely divided silver in the dissolved thermoplastic adhesive can readily be recovered as it will tend to separate from the solution. To prevent the thermoplastic adhesive from spreading, it is preferable that the thermosetting adhesive be formulated to permit it to cure at a temperature below the melting point of the thermoplastic adhesive.

In one example of the process the substrate was a board which was a composite of glass fibers embedded in an epoxy resin matrix. The thermosetting adhesive was formulated as follows:

| | Parts by weight |
|---|---|
| Epon 828 epoxy resin | 20 |
| Metaphenylenediamine | 3 |
| Xylol | 8 |
| Butyl Cellosolve | 16 |

Finely divided silver was mixed with the thermosetting adhesive in the ratio of 5 parts of adhesive to 10 parts of silver.

Epon 828 is an epichlorohydrin/bisphenol A-type, low molecular weight epoxy resin manufactured by the Shell Chemical Company. Epon 828 has a molecular weight of approximately 380 and is a pourable liquid at room temperature. The chemical structure of a typical molecule of Epon 828 is

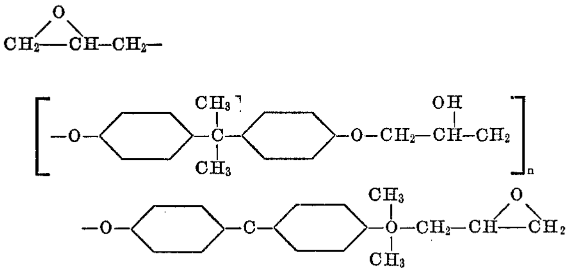

The thermoplastic adhesive was made by mixing 10 parts of finely divided silver in 5 parts of a 50% solution of Epon 1001 epoxy resin in Butyl Cellosolve. Epon 1001 is an epichlorohydrin/bisphenol A-type solid epoxy resin having a molecular weight of approximately 900 and a melting point from 65° to 75° C. Apart from the molecular weight, the chemical structure of a typical molecule of Epon 1001 and of Epon 828 are similar.

Another thermosetting conductive adhesive found to be suitable for deposition through a fine mesh screen was formulated as follows:

| | Parts by weight |
|---|---|
| Phenolic resin No. V65–122 | 20 |
| Butyl Cellosolve | 10 |
| Finely divided silver | 58 |

Phenolic resin No. V65–122 is manufactured by the Marblette Corporation and is a pure phenolic resin of the heat hardening type.

The following formulations are examples of other thermoplastic conductive adhesives that are suitable for deposition through a fine mesh screen, Formulation 1

| | Parts |
|---|---|
| Epon 1001 epoxy resin | 20 |
| Xylol—⅓<br>Cellosolve—⅓<br>Methyl isobutyl ketone—⅓ | 80 |
| Finely divided silver | 55 |

Formulation 2

Finely divided silver is mixed with an equal part of a 40% solution of Acryloid B–66 acrylic resin in toluene. Acryloid B–66 is an acrylic resin copolymer manufactured by Rohm & Haas.

Formulation 3

Five parts of finely divided silver are mixed with 10 parts of a 30% water solution of polyvinylpyrrolidone type NP K–60. (PVP type NP K–60 is a product of the Antara Chemicals Division of General Aniline & Film Corporation.

Where the Formation 3 thermoplastic is used as the soluble adhesive, it should not be subjected to temperatures above 130° C. to prevent the occurrence of cross-linking. If this precaution is observed, the Formulation 3 thermoplastic can easily be removed from the substrate, after the plating resist is removed, by washing with water.

In the preceding formulations the thermosetting and thermoplastic resins were loaded with finely divided silver to cause them to be electrically conductive. It is, of course, obvious that other electrically conductive materials, such as copper or gold, can be loaded into the resins in lieu of the silver. Silver is the preferred metal because of its high electrical conductivity and because even when the silver is oxidized, the electrical conductivity is but slightly impaired.

In carrying out the process, it is preferred to coat the entire non-image area, as in FIG. 2 with the electrically conductive thermoplastic adhesive as this tends to provide the most uniform thickness of plate over the discrete areas. However, it is apparent that the entire non-image area need not be coated with the electrically conductive thermoplastic adhesive because the purpose of applying that adhesive is to insure that a conductive path exists from each discrete area to the common terminal. To conserve material, the electrically conductive thermoplastic adhesive can be laid down on the non-image area in the form of parallel stripes, as in FIG. 2A, or as a grid formed by two sets of crossed parallel stripes. The grid of parallel stripe formation must be sufficiently dense to insure that all image areas are connected to the common terminal by conductive paths of sufficient current carrying capacity to permit efficient and substantially uniform plating of the discrete areas. In FIG. 2A, the parallel stripes are depicted as merging into a common terminal formed by the thermoplastic adhesive extending along the edges of the board. It is obvious that the stripes may proceed to the edge of the board and can, when the plating operation is to be performed, be joined by an electrically conductive wide clip which contacts each parallel stripe. The wide clip then, in effect, is the common terminal and can repalce the thermoplastic adhesive common terminal at the edges of the board.

The process can be modified by first laying down the electrically conductive thermoplastic adhesive as a pattern of diagonal stripes upon the surface of the non-conductive substrate, as in FIG. 4. The thermoplastic adhesive is applied in fluid form through a screen or is printed upon the surface by a stripped cylinder. After being deposited upon the substrate, heat is applied to drive off the solvents and the thermoplastic adhesive subsequently solidifies. The thermosetting adhesive is then printed upon or deposited through a silk screen upon the discrete areas to be plated, as in FIG. 1. The electrically conductive thermosetting adhesive, of course, then lies atop the diagonal stripes in the discrete areas. The board is heated to cause the thermosetting adhesive to cure and become infusible and insoluble. The remaining steps in the process relating to the application of the plating resist, electroplating of the board, removal of the plating resist, and removal of the thermoplastic adhesive are then the same as described above.

I claim:

1. A process for simultaneously electroplating a plurality of discrete areas on an insulative substrate comprising the steps of (A) depositing over each discrete area an uncured thermosetting electrically conductive adhesive, (B) curing the thermosetting electrically conductive adhesive to cause it to become infusible and insoluble, (C) connecting each discrete area to a common terminal by providing an electrical path through a thermoplastic electrically conductive adhesive deposited upon the substrate.

(D) covering the electrically conductive areas that are not to be plated with a plating resist, (E) connecting an electrode to the common terminal and causing the exposed electrically conductive areas to be electroplated, (F) removing the plating resist to uncover the thermosplastic adhesive, and (G) removing the electrically conductive thermoplastic adhesive by dissolving it in a solvent to which the thermoset adhesive is resistant.

2. The process according to claim 1 for simultaneously electroplating a plurality of discrete areas, wherein a step A is accomplished by depositing the uncured thermosetting adhesive through a screen having a positive image of the discrete areas to be plated, and step C is accomplished by employing a negative image screen to deposit the thermoplastic adhesive as a fluid solution upon the non-image area, and further including the step of removing the solvent from the thermoplastic adhesive to cause the thermoplastic adhesive to solidify upon the substrate.

3. The process according to claim 1, wherein the thermoplastic electrically conductive adhesive is coated upon the entire non-image area of the substrate.

4. The process according to claim 1, wherein the thermoplastic electrically conductive adhesive is applied over the non-image area of the substrate as a pattern of stripes.

5. The process according to claim 1 wherein, prior to the deposition upon the discrete areas of the thermosetting adhesive, the thermoplastic electrically conductive adhesive is applied as a grid or pattern of stripes upon the surface of the substrate and step A is performed by depositing the uncured thermosetting electrically conductive adhesive over the thermoplastic adhesive pattern in the discrete areas.

References Cited

UNITED STATES PATENTS

| | | | |
|---|---|---|---|
| 2,834,723 | 5/1958 | Robinson | 204—15 |
| 3,146,125 | 8/1964 | Schneble, Jr., et al. | 204—15 |
| 3,171,796 | 3/1965 | Stephens et al. | 204—15 |

JOHN H. MACK, Primary Examiner

T. TUFARIELLO, Assistant Examiner